(12) United States Patent
Sinsheimer et al.

(10) Patent No.: US 11,604,219 B2
(45) Date of Patent: Mar. 14, 2023

(54) AUTOMATIC TEST EQUIPEMENT HAVING FIBER OPTIC CONNECTIONS TO REMOTE SERVERS

(71) Applicant: Teradyne, Inc., North Reading, MA (US)

(72) Inventors: Roger A. Sinsheimer, North Reading, MA (US); Daniel L. Engel, North Reading, MA (US); Leal J. Daniels, North Reading, MA (US)

(73) Assignee: TERADYNE, INC., North Reading, MA (US)

( * ) Notice: Subject to any disclaimer, the term of this patent is extended or adjusted under 35 U.S.C. 154(b) by 0 days.

(21) Appl. No.: 17/122,570

(22) Filed: Dec. 15, 2020

(65) Prior Publication Data

US 2022/0187357 A1 Jun. 16, 2022

(51) Int. Cl.
| | |
|---|---|
| *G01R 1/04* | (2006.01) |
| *G01R 1/067* | (2006.01) |
| *G01R 1/073* | (2006.01) |
| *G01R 31/28* | (2006.01) |
| *G01R 31/317* | (2006.01) |
| *G01R 1/06* | (2006.01) |

(52) U.S. Cl.
CPC ........... *G01R 31/2834* (2013.01); *G01R 1/06* (2013.01)

(58) Field of Classification Search
CPC ...... G01R 31/04; G01R 31/06; G01R 31/067; G01R 31/073; G01R 31/01; G01R 31/28; G01R 31/2834; G01R 31/317; G01R 31/319; G01R 31/3185; G01R 1/04; G01R 1/06; G01R 1/067; G01R 1/073
See application file for complete search history.

(56) References Cited

U.S. PATENT DOCUMENTS

| | | | |
|---|---|---|---|
| 5,471,148 | A | 11/1995 | Sinsheimer et al. |
| 5,528,158 | A | 6/1996 | Sinsheimer et al. |
| 5,629,630 | A | 5/1997 | Thompson et al. |
| 6,027,346 | A | 2/2000 | Sinsheimer et al. |
| 6,107,813 | A | 8/2000 | Sinsheimer et al. |

(Continued)

FOREIGN PATENT DOCUMENTS

| | | |
|---|---|---|
| CN | 1659810 A | 8/2005 |
| CN | 101610112 A | 12/2009 |

(Continued)

OTHER PUBLICATIONS

Hayes, Jim., "The Tester in Your Pocket", Published on: Dec. 2011 Available at: http://www.ecmag.com/section/systems/tester-yourpocket.

(Continued)

*Primary Examiner* — Neel D Shah
(74) *Attorney, Agent, or Firm* — Burns & Levinson LLP

(57) ABSTRACT

An example test system includes a test head, and a device interface board (DIB) configured to connect to the test head. The DIB is for holding devices under test (DUTs). The DIB includes electrical conductors for transmitting electrical signals between the DUTs and the test head. Servers are programmed to function as test instruments. The servers are external to, and remote from, the test head and are configured to communicate signals over fiber optic cables with the test head. The signals include serial signals.

17 Claims, 6 Drawing Sheets

(56) References Cited

U.S. PATENT DOCUMENTS

| | | | |
|---|---|---|---|
| 6,157,200 A * | 12/2000 | Okayasu | G01R 31/31924 324/762.02 |
| 6,166,553 A | 12/2000 | Sinsheimer | |
| 6,784,679 B2 | 8/2004 | Sweet et al. | |
| 6,801,306 B2 | 10/2004 | Fontaine | |
| 6,833,696 B2 | 12/2004 | Sinsheimer et al. | |
| 6,871,307 B2 | 3/2005 | Nachumovsky | |
| 6,888,427 B2 | 5/2005 | Sinsheimer et al. | |
| 6,911,835 B2 | 6/2005 | Chraft et al. | |
| 6,951,482 B1 | 10/2005 | Miller et al. | |
| 6,963,211 B2 | 11/2005 | Sinsheimer et al. | |
| 7,078,890 B2 | 7/2006 | Sinsheimer et al. | |
| 7,079,743 B2 | 7/2006 | Lauzier et al. | |
| 7,295,024 B2 | 11/2007 | Sinsheimer | |
| 7,307,293 B2 | 12/2007 | Fjelstad et al. | |
| 7,358,754 B2 | 4/2008 | Sinsheimer et al. | |
| 7,373,069 B2 | 5/2008 | Lazo | |
| 7,382,143 B2 | 6/2008 | Di Stefano | |
| 8,416,290 B2 | 4/2013 | Ryan et al. | |
| 8,558,992 B2 | 10/2013 | Steffey | |
| 8,575,954 B2 | 11/2013 | Chong et al. | |
| 8,577,212 B2 | 11/2013 | Thiel | |
| 8,660,581 B2 | 2/2014 | Davis et al. | |
| 9,151,694 B2 | 10/2015 | Wilson et al. | |
| 9,435,855 B2 | 9/2016 | Lewinnek et al. | |
| 9,594,114 B2 | 3/2017 | Sinsheimer | |
| 9,786,977 B2 | 10/2017 | Lyons et al. | |
| 9,800,330 B1 | 10/2017 | Yusuf et al. | |
| 10,060,475 B2 | 8/2018 | Sinsheimer et al. | |
| 10,451,652 B2 | 10/2019 | Sinsheimer et al. | |
| 2002/0130653 A1 | 9/2002 | Frame | |
| 2005/0083067 A1 | 4/2005 | Kirbas | |
| 2007/0126439 A1 | 6/2007 | Sinsheimer et al. | |
| 2007/0176615 A1 | 8/2007 | Sinsheimer | |
| 2008/0025012 A1 | 1/2008 | Sinsheimer | |
| 2008/0030211 A1 | 2/2008 | Sinsheimer | |
| 2008/0030212 A1 | 2/2008 | Sinsheimer | |
| 2008/0030213 A1 | 2/2008 | Sinsheimer | |
| 2012/0152309 A1 | 6/2012 | Miller et al. | |
| 2012/0299798 A1 | 11/2012 | Leisten | |
| 2013/0013268 A1 | 1/2013 | Woolf et al. | |
| 2015/0103336 A1 | 4/2015 | Rolston et al. | |
| 2015/0116699 A1 | 4/2015 | Meek et al. | |
| 2016/0131702 A1 | 5/2016 | Sinsheimer | |
| 2018/0080978 A1 * | 3/2018 | Brown | G01R 1/07385 |
| 2019/0377007 A1 * | 12/2019 | Mirkhani | G01R 31/2889 |
| 2022/0034963 A1 * | 2/2022 | Keck | G01R 1/071 |

FOREIGN PATENT DOCUMENTS

| | | |
|---|---|---|
| EP | 1317088 A1 | 6/2003 |
| EP | 2773068 B1 | 4/2019 |
| KR | 20110101726 A | 9/2011 |
| WO | 2016010888 A1 | 1/2016 |

OTHER PUBLICATIONS

McLaughlin, et al.,"Use your smartphone as a fiber optic tester", Published on: Sep. 24, 2010 Available at: http://www.cablinginstall.com/articles/2010/09/use-your-smartphone-as-a-fiber-optic-tester.html.

Torlak, Murat., "Fiber Optic Communications", Published on: Feb. 27, 2012; Available at: https://www.utdallas.edu/-torlak/courses/ee4367/lectures/FIBEROPTICS.pdf.

"Measurement of Optical Filters", Published on: Jul. 27, 2013; Available at: http://www.semrock.com/measurement-of-optical-filters.aspx.

Johnston, Hamish., "Frequency comb takes a measure of distance", Published on: May 10, 2012 Available at: http://physicsworld.com/cws/article/news/2012/May/10/frequency-comb-takes-a-measureof-distance.

Mochizuki, et al., "Optical Fiber Dispersion Measurement Technique Using a Streak Camera", In Journal of Lightwave Technology, vol. 5, Issue 1, Jan. 1987, pp. 119-124.

Navruz, et al., "Smart-phone based computational microscopy using multi-frame contact imaging on a fiber-optic array", In Journal of Lab Chip, Issue 20, Oct. 21, 2013, 9 pages.

International Search Report dated Apr. 11, 2022, International Application No. PCT/US2021/062041 filed Dec. 6, 2021, (9 pages).

Written Opinion of the International Searching Authority dated Apr. 11, 2022. International Application PCT/US2021/062041 filed Dec. 6, 2021, (4 pages).

* cited by examiner

AUTOMATIC TEST EQUIPEMENT HAVING FIBER OPTIC CONNECTIONS TO REMOTE SERVERS

TECHNICAL FIELD

This specification describes examples of automatic test equipment (ATE) having fiber optic connections to remote servers.

BACKGROUND

Automatic test equipment (ATE) includes systems configured to perform tests on devices, known as the devices under test (DUT). Example ATE includes a test head for routing test signals to DUTs and a device interface board (DIB) for implementing electrical and mechanical connections to the DUTs.

SUMMARY

An example test system includes a test head, and a device interface board (DIB) configured to connect to the test head. The DIB is for holding devices under test (DUTs). The DIB includes electrical conductors for transmitting electrical signals between the DUTs and the test head. Servers are programmed to function as test instruments. The servers are external to, and remote from, the test head and are configured to communicate signals over fiber optic cables with the test head. The signals include serial signals. The test system may include one or more of the following features, either alone or in combination.

The test head may include a signal interface board. The signal interface board may include a cable interface to connect to the fiber optic cables and an electrical interface to connect to the electrical conductors. The fiber optic cables may be configured to perform conversion between optical signals and the electrical signals. The signal interface board may be configured to condition electrical signals for output to the DIB. In some examples, the signal interface board, rather that the fiber optic cables, may be configured to perform conversion between optical signals and the electrical signals. The signal interface board may also be configured to increase a signal power of the electrical signals for output to the DIB. The serial signals may include real-time serial scan test vectors. The real-time serial scan test vectors may be provided to pins of a DUT connected to the DIB.

The test system may include an isolation power supply that is external to the test head. The isolation power supply may be configured to provide power from a location of the servers to the test head for use in decoding optical signals sent over the fiber optic cables to the test head. Electrical signals in the test head may be referenced with respect to an instrument ground. The instrument ground of the test head may also act as a ground reference for the isolation power supply.

The fiber optic cables may be two meters (2 m) long or greater. The serial signals may be transmitted at five gigabits-per-second (5 Gbps) or greater. The serial signals may be or include pulsed digital signals. The test head may be devoid of test electronics or include test electronics. The servers may include general-purpose computing devices that are programmed to function as test instruments. The serial signals may include, for example, USB-protocol or PCIe-protocol digital signals.

An example test system includes a test head having first circuitry to condition an electrical signal that is an expression of an optical signal. The optical signal is from fiber optic cable and the electrical signal is for a device under test. A server is programmed to function as a test instrument. The server is external to, and remote from, the test head. The server is configured to communicate over the fiber optic cable. The electrical signal and the optical signal include serial signals. The test system may include one or more of the following features, either alone or in combination.

The electrical signal may include test vectors to be transmitted to the DUT. The server may be configured to receive test results obtained from the DUT that are responsive to the test vectors sent to the DUT. The fiber optic cable may be two meters (2 m) long or greater. The serial signals may be transmitted at five gigabits-per-second (5 Gbps) or greater. The serial signals may be or include pulsed digital signals. The test head may be devoid of test electronics or include test electronics. The server may include one or more general-purpose computing devices that are programmed to function as one or more test instruments. The serial signals may include a USB-protocol digital signal, a PCIe-protocol digital signal, or a digital signal that complies with any appropriate industry-standard signaling protocol.

The test system may include an isolation power supply that is external to the test head. The isolation power supply is configured to provide power from a location of the server to the test head for use in decoding an optical signal. Electrical signals in the test head may be referenced with respect to an instrument ground. The instrument ground of the test head may act as a ground reference for the isolation power supply. Electrical signals in the test head may be referenced with respect to a first ground. The isolation power supply may include an isolation transformer to isolate the first ground from a second ground that is different from the first ground.

Another example test system includes means for connecting electrically and mechanically to devices under test (DUTs); means for conditioning electrical signals obtained by conversion from optical signals; and means for generating test vectors that are converted to optical signals for transmission over fiber optic cable. The means for generating includes one or more general-purpose servers that are remote from a point of connection to the DUTs.

Any two or more of the features described in this specification, including in this summary section, may be combined to form implementations not specifically described in this specification.

At least part of the systems and techniques described in this specification may be configured or controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the systems and techniques described in this specification may be configured or controlled using a computing system comprised of one or more processing devices and memory storing instructions that are executable by the one or more processing devices to perform various control operations. The systems and techniques, and components and variations thereof, described herein may be configured, for example through design, construction, arrangement, placement, programming, operation, activation, deactivation, and/or control.

The details of one or more implementations are set forth in the accompanying drawings and the following description. Other features and advantages will be apparent from the description and drawings, and from the claims.

DESCRIPTION OF THE DRAWINGS

Like reference numerals in different figures indicate like elements.

DETAILED DESCRIPTION

Described herein are example implementations of a test system, or ATE, that includes a test head having a cable interface to connect to fiber optic cables and an electrical interface to connect to electrical conductors. A device interface board (DIB) is configured to connect to the test head via the electrical interface. The DIB is for holding devices under test (DUTs) and includes the electrical conductors for transmitting electrical signals between the DUTs and the electrical interface of the test head. Servers are programmed to function as test instruments. The servers may be general-purpose servers or other types of general-purpose computing devices, such as the computing systems described herein. The servers are external to, and remote from, the test head and are configured to communicate over the fiber optic cables, over which optical signals are sent towards and away from the test head. Accordingly, traditional instrument data processing functions may be located outside of the test head. In some implementations, the remote servers replace test instruments that would otherwise reside within the test head. The fiber optic cables may enable such remote configurations, since the data transfer rate over the fiber optic cables is great enough to make up for the distance between the remote servers and the test head. In some cases, use of one or more general purpose servers may reduce the cost and complexity of the ATE and enable greater configurability of the ATE.

Figure 1:
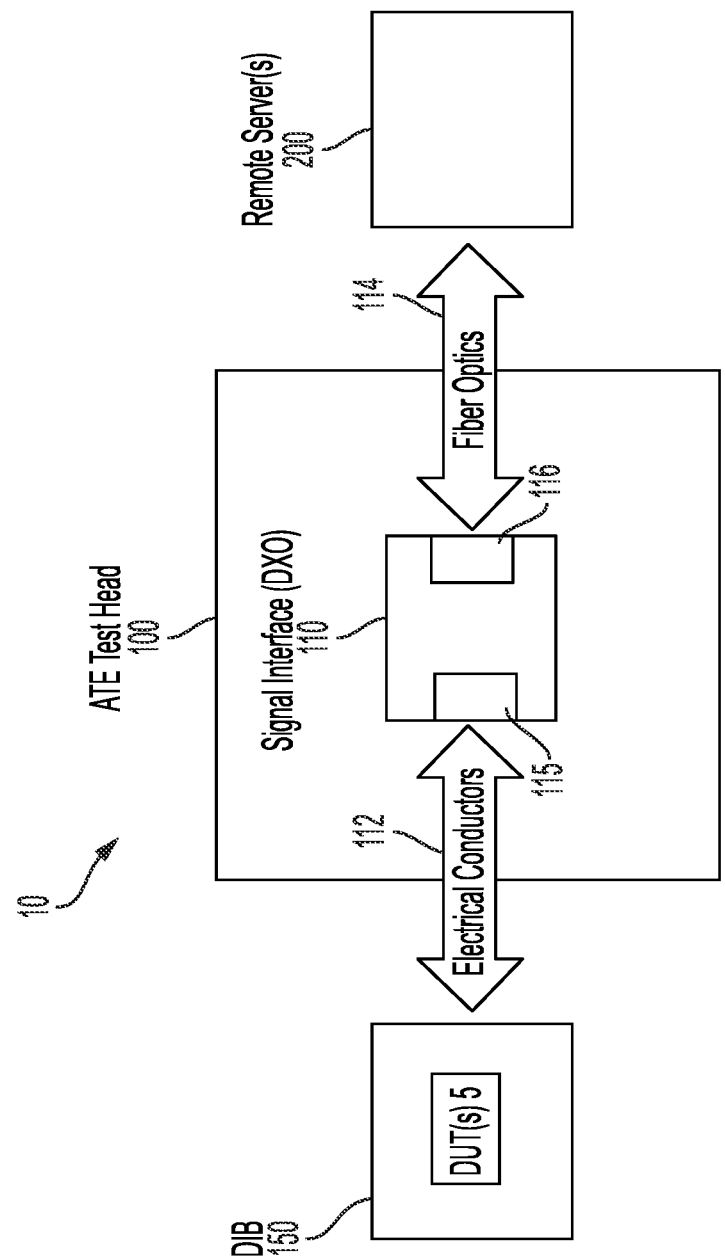
FIGS. 1 to 3 are block diagrams showing components of example automatic test equipment (ATE) having fiber optic connections to remote servers.
Figure 2:
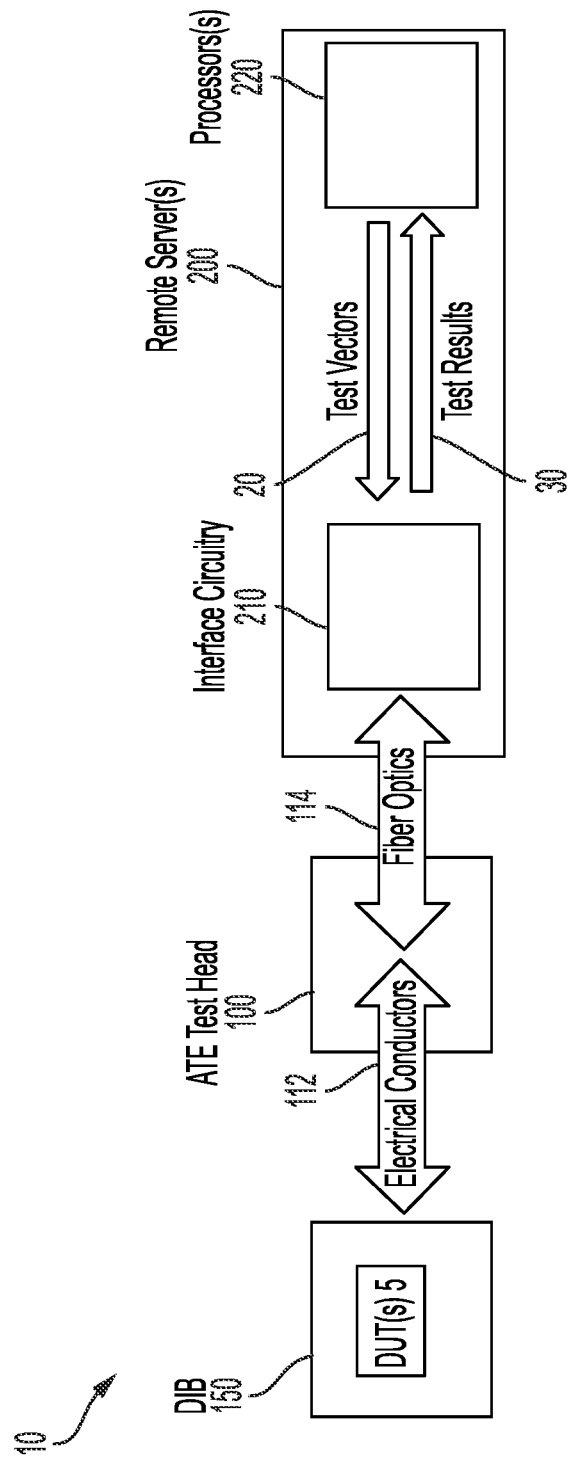
Figure 3:
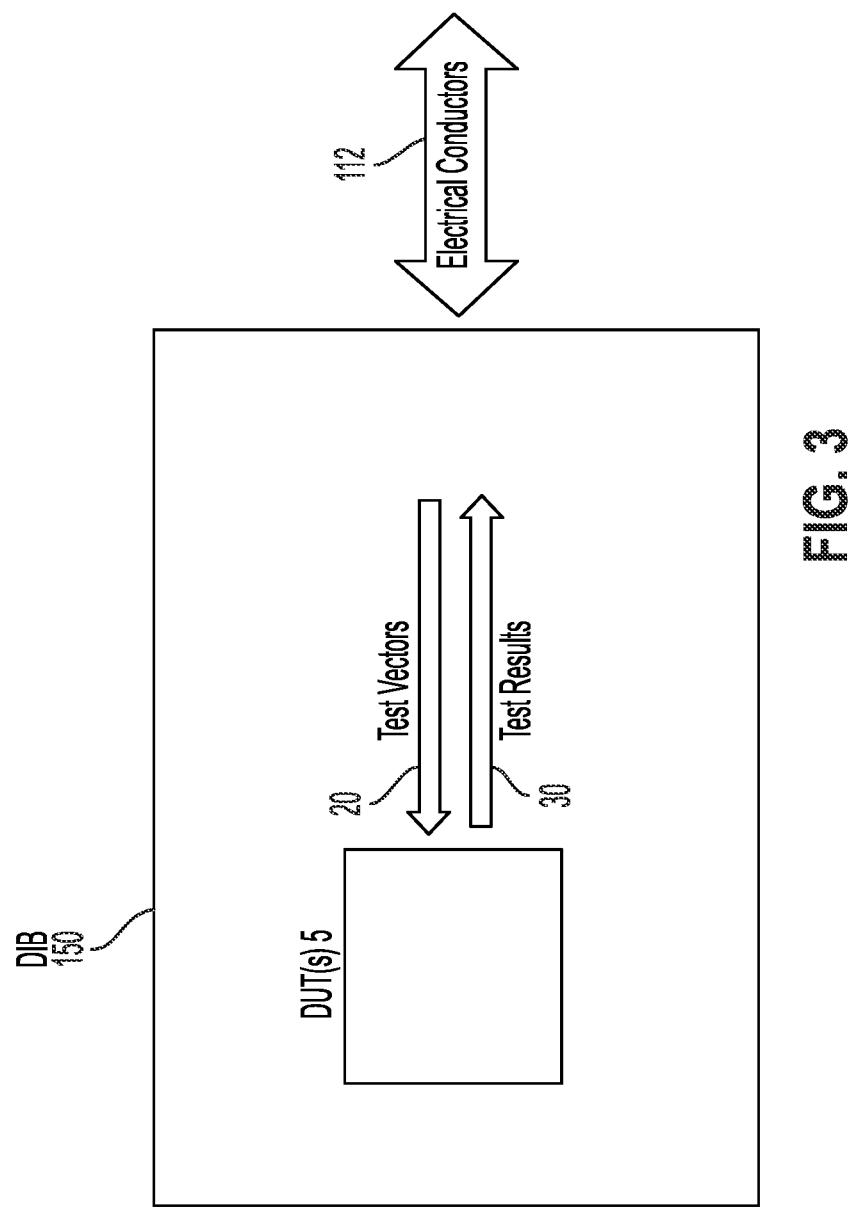

FIGS. 1 to 3 show example ATE 10, which includes features of the ATE described in the preceding paragraph. ATE 10 includes test head 100. Test head 100 includes a mechanical and electrical interface between test instruments and a device interface board (DIB) 50 that hold DUTs 5. Test head 100 includes one or more power sources (not shown) to provide power to the DUTs and other components of the ATE. In some implementations, test head 100 includes test instruments and/or test electronics, such as pin electronics or the like, for use in testing a DUT connected to the DIB. In some implementations, test head 100 is devoid of such test instruments and/or test electronics. For example, all or some of the test instruments and/or test electronics may be located at a remote site a distance away from the test head. Such remote test instruments and/or test electronics may be connected to the test head via optical media, such as fiber optic cables 114, that have data transfer rates that enable remote connections on the order of single, tens, or hundreds of meters, for example.

DIB 150 includes electrical and mechanical connections between DUTs and the test head. For example, DIB 150 may include a printed circuit board (PCB) that is connected to test head 100 and that includes mechanical and electrical interfaces to one or more DUTs that are being tested or are to be tested by the ATE. Power, including voltage, may be run via one or more conduits in the DIB to DUTs connected to the DIB. The DIB includes sites, which may include pins, ball grid array (BGA) pads, or other points of electrical and mechanical connection to which the DUTs may connect. Test signals and response signals such as digital signals and other signals pass via test channels over the sites between the DUTs and test instruments. DIB 15 may also include, among other things, connectors, conductive traces and circuitry for routing signals between test electronics, DUTs connected to the sites, and other circuitry. DIB 150 also includes electrical conductors for transmitting electrical signals between the DUTs and electrical interface 115 of the test head to the DIB.

DIB 150 connects electrically and mechanically to a signal interface ("DXO") board 110 that is a component of the test head of that is connected to the test head (but that is not the entirety of the test head). In this regard, signal interface board 110, and thus the test head 100, includes an electrical and mechanical interface to which DIB 150 is configured to connect. Signal interface board 110 may include a PCB that is within or on test head 10. Signal interface board 110 includes a cable interface 116 to connect to fiber optic cables 114 and an electrical interface 115 to connect to electrical conductors 112 to and from the DIB. Fiber optic cables 114 include, at server-side of the cable and at the test head-side of the cable, conversion electronics, which may be powered at both ends by electricity provided, for example, by universal serial bus (USB) cards within a remote test instrument server. Accordingly, in some implementations, cable interface 116 is an electrical interface, since it connects to the conversion electronics on the fiber optic cables. The conversion electronics at both ends of the fiber optic cable are configured to convert electrical signals to optical signals that are expressions of the electrical signals for transmission over the fiber optic cable and to convert optical signals from the fiber optic cable to electrical signals that are electrical expressions of the optical signals for transmission to the DIB over electrical conductors 112 the test head-side or to the remote servers at the server-side. For example, in electronics attached to the fiber optic cables, an electrical serial data stream may be converted to an optical expression of the electrical serial data stream for transmission over the fiber optic cable and that optical expression of the electrical serial data may be converted back into electrical serial data for transmission to the DIB.

In some implementations, electrical interface 115 on signal interface board 110 may be configured to condition, in the electrical domain, the electrical signals output to DIB 150 and to increase a signal power of the electrical signals output to DIB 150. For example, signal interface board 110 may include circuitry to condition the signals to ensure that the electrical signals have a timing that is consistent with the data stream protocol being used on the DIB and are as strong as possible. Signal interface board 110 may also include circuitry to amplify the signals or to increase the power of the signals. Signal interface board 110 may also include circuitry to amplify and condition returned electrical signals from the DIB 150.

One or more fiber optic cables 114 (or other appropriate optical media) run between signal interface board 110 and one or more remote servers 200. In this regard, example implementations of ATE 10 enable a high-speed data connection between test head 100 and one or more remote servers 200, which enables remote signal generation and processing capabilities. Fiber optic cables 114 may be used to transmit test signals, such as serial scan test vectors, generated at the remote servers to the ATE test head. In this regard, during an example serial scan, a test vector load is transmitted from a server acting as a test instrument to the DUT over the fiber optic high speed serial link. The DUT performs one or more operations based using the contents of the test vector load. The response of the DUT to the test vector load is recorded and transmitted back over the fiber optic high speed serial link to the server acting as a test instrument. This server, in turn, evaluates the response and determines if the DUT is compliant with predefined functional requirements as determined by a test engineer. If a DUT is fully compliant the DUT is labeled as "Good". If a DUT is non-compliant, the DUT will be binned as "Bad" and characterized as to what portion of the DUT failed, or characterized as having inferior performance and binned accordingly.

In the example of FIGS. 1 to 3, fiber optic cables 114 are used to transmit test signals, such as test vectors, as optical signals to signal interface board 110. Fiber optic cables 114 are configured to convert the optical signals to electrical signals at the test-head side, which are then conditioned by the signal interface board and transmitted to DUTs via the DIB. In the return direction, electrical test result signals are transmitted through the signal interface board 110 from the DUT via the DIB. Those signals may be conditioned by the signal interface board. Following conditioning, electronics attached to the fiber optic cables 114 convert those electrical signals to optical signals and transmit the resulting electrical signals to remote servers 200 for analysis over fiber optic cables 114. In some implementations, conversion from optical signals to electrical signal expressions thereof and from electrical signals to optical signal expressions thereof may be performed by the signal interface board rather than by electronics in or attached to the fiber optic cable.

As noted above, the signal interface board includes circuitry to condition electrical signals received from the fiber optic cables for output to DIB 150 and to increase a signal power of the electrical signals output to DIB 150. Signal interface board 110 may also include circuitry to amplify and condition returned electrical signals from the DIB 150 for output to the fiber optic cable. For example, signal interface board 110 may be configured to condition the electrical signals to ensure that the signal stream is consistent timing-wise with the data stream protocol being used by the DIB and/or the servers acting as test instruments, complies with other requirements of that protocol, and has an increased or maximized signal power.

In some implementations, the fiber optics enable high speed data transfer rates such as, but not limited to, five gigabits-per-second (5 Gbps) or greater data transfer rates, and support reliable transmissions between the remote servers and the test head. The fiber optics thus enables the remote servers to be located a significant distance—for example 2 m, 5 m, 12 m, 15 m, 100 m, etc. —from the test head, in some examples without adversely impacting performance. This approach may enable a flexible—for example, general purpose—test head, where all or some of the test control, processing, and analysis are performed by remote servers 200.

Data transmitted over fiber optic cables may be serial data. Accordingly, the fiber optic cables function as high-speed serial connections between the test head and the remote servers. Any appropriate industry-standard signaling data stream protocol may be used for data transmission, examples of which are the Universal Serial Bus (USB) protocol and the Peripheral Component Internet Express (PCIe) protocol.

Figure 5:
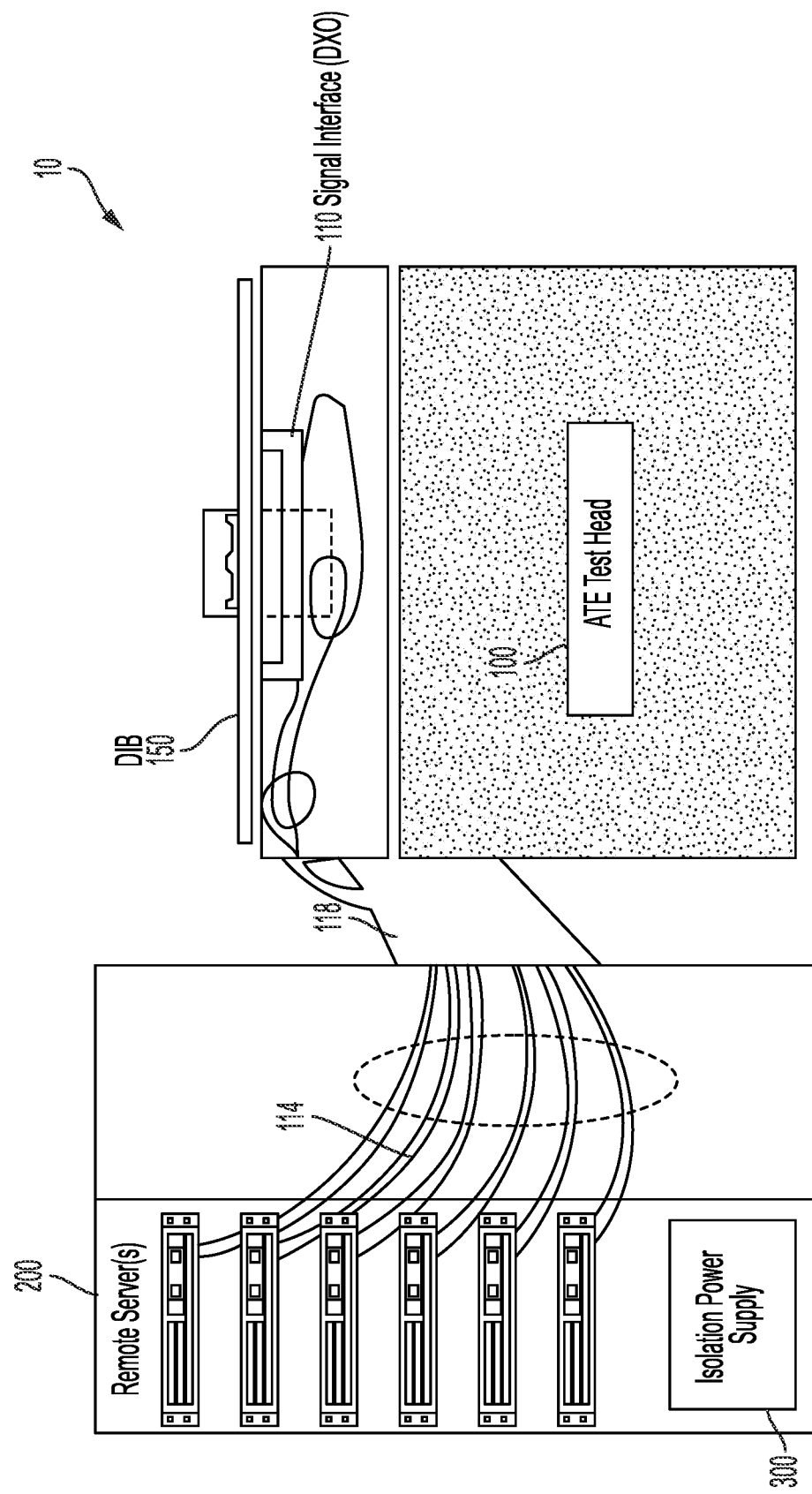
FIG. 5 is an illustration showing example ATE having fiber optic connections to remote servers.

As noted, test system 10 includes one more remote servers 200. In the example of FIG. 5, there are six remote servers; however, any number may be used. Remote servers 200 include general-purpose computing devices, which are programmable to, and programmed to, operate as test instruments. The servers include hardware devices and may include one or more processing devices and computer memory. For example, each server may be configured—for example, programmed—to output digital test signals such as test vectors or, in some implementations, to output digitized versions of analog test signals or radio frequency (RF) test signals to test a DUT based, e.g., on data provided by a control system. Each server may be configured—for example, programmed—to receive digital response signals or digitized versions of analog response signals or RF response signals from the DUT in response to the initial test signals. Different ones of servers 200 may be configured to perform different types of tests, to implement different types of testing functionality, and/or be configured to test different DUTs or different types of DUTs. Two or more of servers 200 may be configured to perform the same types of tests, to implement the same types of testing functionality, and/or be configured to test the same DUTs or the same types of DUTs.

The test signals and response signals may travel over one or more serial test channels configured between servers 200 and test head 100 using fiber optic cables 114 and electrical media. In some examples, a test channel may include the physical transmission medium or media over which signals are sent from a test instrument to a DUT and over which signals are received from the DUT.

In some implementations, because remote servers 200 are configured to function as test instruments, test head 100 may be devoid of test electronics, although in other implementations, test head 100 may include test electronics so as to provide for both on-board and remote testing capabilities. In example implementations, remote servers 200 may include interface circuitry 210 for conditioning and strengthened electrical signals on the server side for transmission to the servers in the manner described herein. At the server side, electronics in the fiber optic cables is configured to convert test data including, but not limited to, serial test vectors 20, into optical signals to send to test head 100. Electronics in the fiber optic cables is also configured to receive and to convert optical signals from test head 100 (e.g., representing serial test results 30) back into electrical signals. Those signals may be conditioned and strengthened as described herein and sent for analysis by the processors 220 in servers 200.

In some implementations, different instances of this interface circuitry may reside within or be coupled to individual ones of servers 200. In some implementations, the interface circuitry may include USB fiber optic interfaces. In some implementations, the interface circuitry includes a serial output port that is used to connect a general purpose processor associated with the remote servers to the fiber optic cables.

Some DUTs include specific pins dedicated for testing. As noted, some DUTs have built-in test capabilities. As such, those DUTs need only receive test vectors, which then may be used by internal programming or circuitry to perform tests and to provide test results. Those test results may be sent back to the test instruments—in this example, servers 200—for analysis. In some implementations, servers 200 are configured to generate such test vectors and transmit those test vectors over fiber optic cables. Response signals are then received as described. In this regard, the test vector signal streams may be generated in a server and delivered to a USB card in the server. The signals are then delivered to USB cable and converted to optical signals by electronics in the fiber optic cables. The signals then travel the length of the optical cable to the signal interface board, where inside the cable assembly they are converted back to electrical signals. Conversely signals from the DUT are delivered to the signal interface board and are amplified and re-timed by a re-timer chip, which then delivers the signals to an electrical interface of a USB cable. That interface (powered from the server at the far end of the fiber optic cable) converts the signals into optical signals which are in turn delivered to the USB card in the server over the fiber optic cables.

Accordingly, in example implementations, serial signals, examples of which are or include serial data streams, sent over the fiber optic cables may include real-time serial scan test vectors 20, which may be generated by the processor 220. For example, ATE 100 may provide the real-time serial scan test vectors 20 to one or more connector pins of a DUT via the test head, the signal interface board, and the DIB, as described herein. Serial test results 30 may then be transmitted back from the DUT to the remote servers, again via the DIB and the signal interface board in the test head, where those signals are conditioned prior to optical conversion for transport over the optical media. In some implementations, the serial signals may be pulsed digital signals that comply with the USB or PCIe protocol. In some example, a pulsed digital signal represents a rapid, transient change in amplitude from a baseline value such as "0" to a higher or lower value, followed by a rapid return to the baseline value.

Figure 4:
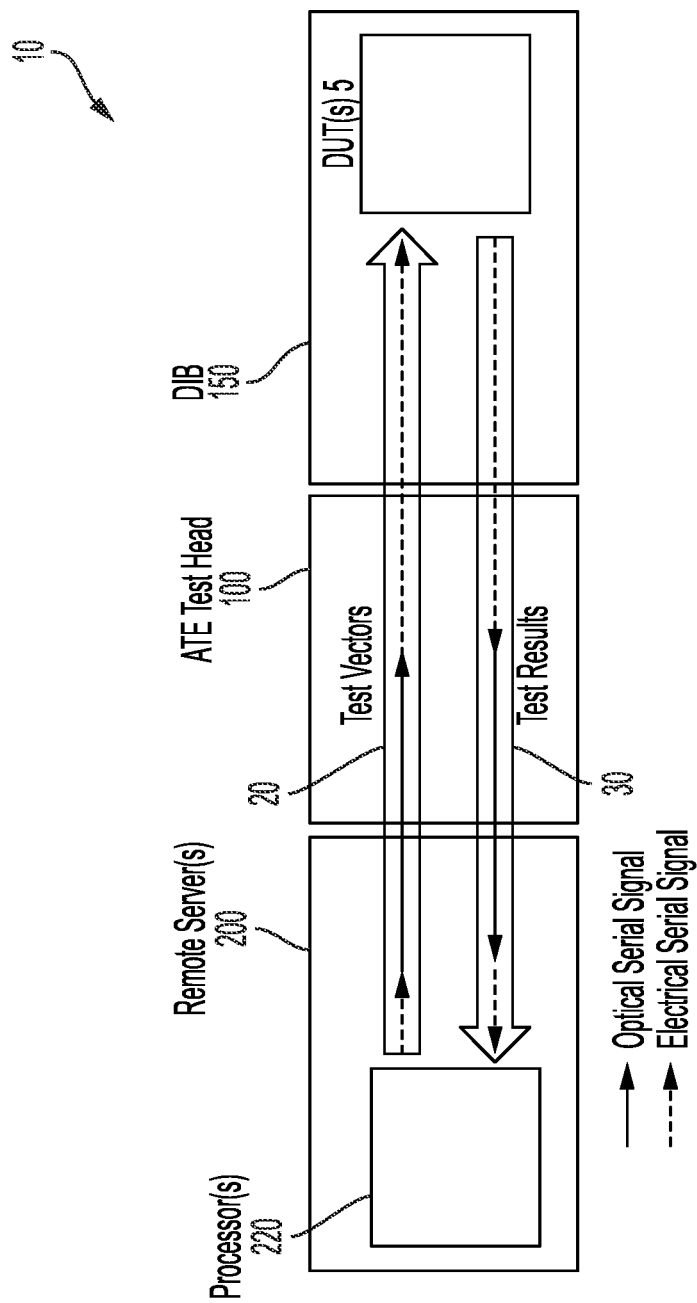
FIG. 4 is a block diagram showing example signal flows that may occur in the ATE of FIGS. 1 to 3.

FIG. 4 illustrates an example signal flow for ATE 10, in which serial test vectors 20 are generated as electrical signals by the processors 220 and transmitted as optical signals from remote servers 200 to test head 100, specifically, to the signal interface board within the test head. The serial test vectors are converted from optical signals back into electrical signals and then conditioned for transmission to DUTs 5 via DIB 150. On the return path, serial test results 30 are received from DUTs 5 at the signal interface board via DIB 150 as electrical signals. The fiber optic cable converts the serial results 30 to optical signals for transmission to remote servers 200. At the server-side, they are converted back to electrical signals for processing processors 220. In some examples, interface circuitry 210 may condition the electrical signals in the manner described herein prior to transmission to the servers.

FIG. 5 shows another example implementation of ATE 10. In the implementation shown in FIG. 5, six remote servers 200 are shown. In this example, each server 200 includes two USB fiber optic interfaces (examples of interface circuitry 210) to connect to fiber optic cables 114. Fiber optic cables 114 interface to the DIB via signal interface board 110 in test head 100 as described herein. This configuration is depicted as 12 USB active optical cables (AOCs), six of which interface with each side of the signal interface board 110. An insulation sock 118 may be used to protect fiber optic cables 114. Signal interface board 110 conditions electrical signals received from the conversion electronics in the fiber optic cable 114 in the manner herein. The conditioned electrical signals are then transmitted to the DUTs via DIB 150, as explained previously. In some implementations, the signal interface board functionality is part of the DIB. In some implementations, the signal interface board may be a component connected to the DIB and not be located within the test head.

To summarize, examples of the ATE described herein includes components for connecting electrically and mechanically to the DUTs, for converting electrical signals to optical signals for transmission over fiber optic cable, for converting optical signals to electrical signals for transmission to the DUTs, and for generating test vectors that are converted to optical signals for transmission over the fiber optic cable.

In the example of FIG. 5, ATE 10 includes an isolation power supply 300. Isolation power supply 300 is remote from test head 100 and may be located near to servers 200, which may include in the same room or cabinet as those servers, or not. For example, isolation power supply may be located 2 m, 5 m, 12 m, 15 m, 100 m, etc. from test head 100. An example isolation power supply includes, for example, a power supply that is electrically isolated from the remainder of the circuit that it is powering, in this example, the test head and components connected thereto. In some implementations, the power supply portion may be isolated using an isolation transformer. Thus, power can be transferred from the input to the output of the isolation power supply absent a direct electrical connection between the two sections.

In this regard, components of test head 100 may be provided with power from an isolation power supply 300. Their return path is all through a single point, known as "instrument star ground" within the test head structure. A "ground" or "electrical ground" includes a voltage that is used as a reference for other voltages. When another instrument is introduced into this environment, the power that that instrument receives is also referenced to instrument star ground. If it is not, then a risk is created that there will be ground loops, or current flowing from one path to another, through the ground path. This in turn can create noise on the electronics both internal and external to the test head. For example, the DIB includes a shared ground/return path that connects to all of the customer's DUTs being test by the ATE. If there is a physical disagreement as to at what voltage level that ground/return path is, then a ground loop will be formed where current will flow from the higher level ground to the lower level ground. To resolve this potential problem, an isolation transformer may be used. In the isolation transformer, power and ground on the load side is completely isolated from power and ground on the source side. A ground cable is connected to instrument star ground on the test head and connected to the load side of the isolation transformer to provide the identical ground reference that is the within the test head. The isolation transformer also may include an alarm circuit for safety. The alarm circuit is configured to sound an alarm if the load side is not properly grounded. There also may be a circuit on the isolation transformer that can be connected to a light to further indicate danger. Using these same contacts, a timed circuit breaker may be configured to shut down the isolation transformer after some predetermined period of time, such as 10 seconds.

Figure 6:
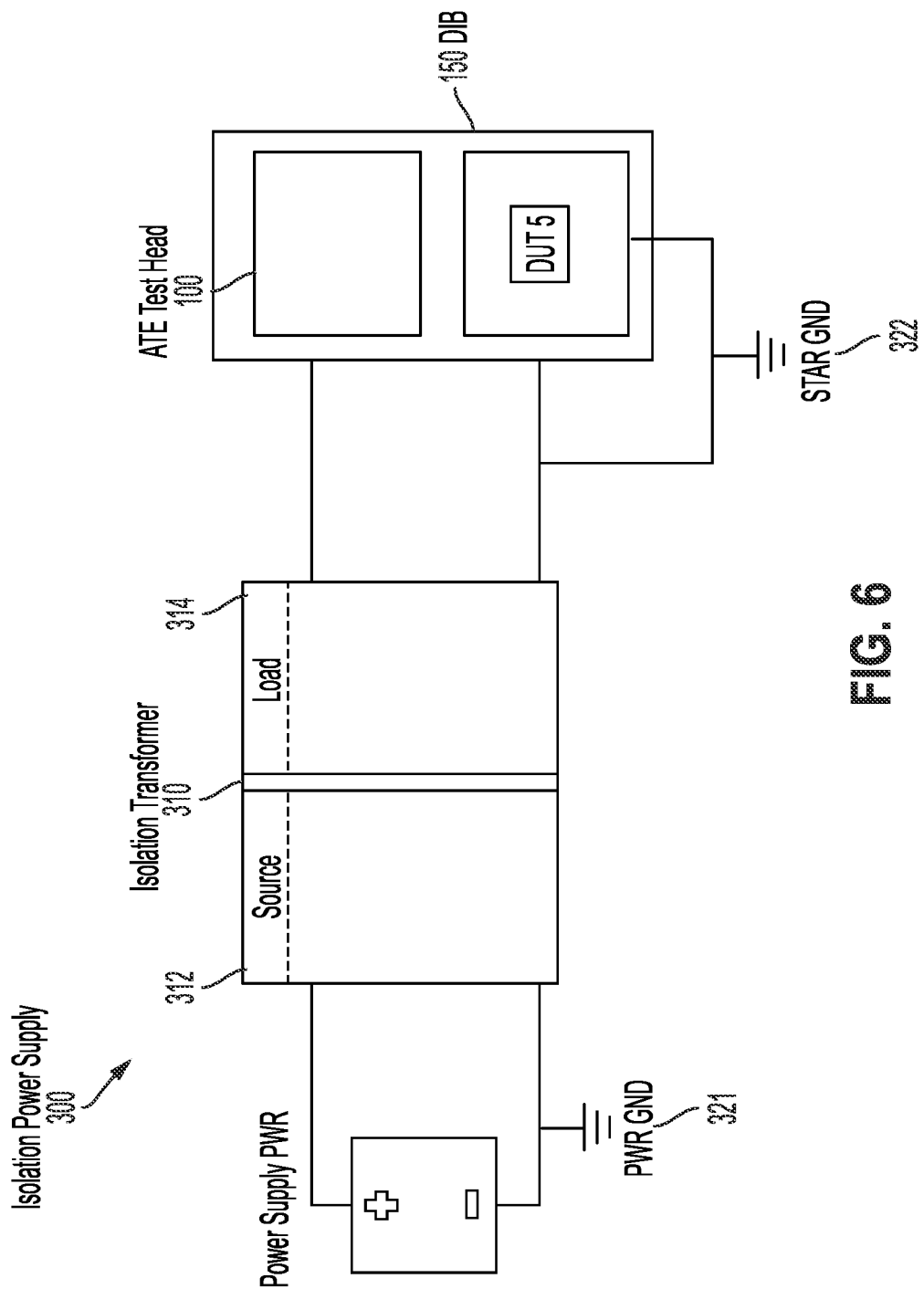
FIG. 6 is a block diagram of an example isolation power supply.

Referring to FIGS. 5 and 6, isolation power supply 300 may be used to supply power to the test head 100 over copper wires that run adjacent to and along with fiber optic cables 114. That power may be used to enable decoding and coding the optical signal on the signal interface board. As shown in FIG. 6, an example implementation of isolation power supply 300 includes an isolation transformer 310. Isolation transformer 310 includes source side 312 that is connected to power ground or "PWR GND" 321. Isolation transformer 310 also includes a load side 314 that is connected to an instrument star ground or "STAR GND" 322. The power ground and the instrument star ground may be at different voltages; however, their electrical isolation prevents or reduces the changes of ground loops. Accordingly, electrical signals on the test head side, including electrical signals through the DIB, may be referenced to the instrument star ground. The servers are also referenced to the instrument star ground and are isolated from the power ground in some implementations.

Some implementations may include a fiber optic cable that allows each end to be powered separately. The fiber by itself provides electrical isolation between the ends of the cable. The isolation transformer is used because both ends of the fiber use server-sourced power to drive the optical-to-electrical (and vice-versa) conversion. In cases where the test head end of the conversion process is powered using test head/instrument-ground-referenced power, an isolation transformer may not be needed.

All or part of the test systems described in this specification and their various modifications may be configured or controlled at least in part by one or more computers such as remote servers 200 using one or more computer programs tangibly embodied in one or more information carriers, such as in one or more non-transitory machine-readable storage media. A computer program can be written in any form of programming language, including compiled or interpreted languages, and it can be deployed in any form, including as a stand-alone program or as a module, part, subroutine, or other unit suitable for use in a computing environment. A computer program can be deployed to be executed on one computer or on multiple computers at one site or distributed across multiple sites and interconnected by a network.

Actions associated with configuring or controlling the test system described herein can be performed by one or more programmable processors executing one or more computer programs to control or to perform all or some of the operations described herein. All or part of the test systems and processes can be configured or controlled by special purpose logic circuitry, such as, an FPGA (field programmable gate array) and/or an ASIC (application-specific integrated circuit) or embedded microprocessor(s) localized to the instrument hardware.

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

An example of fiber optic cable that may be used in the implementations described herein is the "USB 3.2 GEN 2×1 A-A 10G HYBRID ACTIVE OPTICAL CABLES" produced by Cosemi Technologies, Inc.

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. A test system comprising:
   a test head;
   a device interface board (DIB) configured to connect to the test head, the DIB for holding devices under test (DUTs) and the DIB comprising electrical conductors for transmitting electrical signals between the DUTs and the test head;
   servers programmed to function as test instruments, the servers being external to, and remote from, the test head and being configured to communicate optical signals over fiber optic cables with the test head, the optical signals comprising serial signals;
   wherein the test head comprises a signal interface board, the signal interface board comprising a cable interface to connect to the fiber optic cables and an electrical interface to connect to the electrical conductors;
   wherein the signal interface board is configured to perform conversion between the optical signals and the electrical signals; and
   wherein the signal interface board is configured to condition, in an electrical domain, first ones of the electrical signals for output to the DIB by changing a timing of the first ones of the electrical signals so that the timing is consistent with a data stream protocol used on the DIB.

2. The test system of claim 1, wherein the signal interface board is configured to amplify and to re-time second ones of the electrical signals from the DIB prior to conversion of the second ones of the electrical signals to optical signals.

3. The test system of claim 1, wherein the signal interface board is configured to increase a signal power of the first ones of the electrical signals.

4. The test system of claim 1, wherein the serial signals comprise real-time serial scan test vectors.

5. The test system of claim 4, wherein the real-time serial scan test vectors are provided to pins of a DUT connected to the DIB in a form of the first ones of the electrical signals.

6. The test system of claim 1, further comprising:
   an isolation power supply that is external to the test head, the isolation power supply to provide power from a location of the servers to the test head.

7. The test system of claim 6, wherein the electrical signals in the test head are referenced with respect to an instrument ground; and
   wherein the instrument ground acts as a ground reference for the isolation power supply.

8. The test system of claim 1, wherein one or more of the fiber optic cables are two meters (2 m) long or greater than 2 m long.

9. The test system of claim 1, wherein the optical signals are transmitted at five gigabits-per-second (5 Gbps) or at greater than 5 Gbps.

10. The test system of claim 1, wherein the serial signals represent pulsed digital signals.

11. The test system of claim 1, wherein the test head is devoid of test electronics.

12. The test system of claim 1, wherein the test head includes test electronics.

13. The test system of claim 1, wherein the servers comprise general-purpose computing devices that are programmed to function as test instruments.

14. The test system of claim 1, wherein the serial signals comprise USB-protocol digital signals.

15. A test system comprising:
- means for connecting electrically and mechanically to devices under test (DUTs), the means for connecting comprising a device interface board (DIB), the DIB comprising electrical conductors over which electrical signals pass;
- means for conditioning the electrical signals which are obtained by conversion from optical signals, the means for conditioning comprising a test head; and
- means for generating test vectors that are converted to optical signals for transmission over fiber optic cable, the means for generating comprising one or more general-purpose servers that are remote from a point of connection to the DUTs;
- wherein the test head comprises a signal interface board, the signal interface board comprising a cable interface to connect to the fiber optic cable and an electrical interface to connect to the electrical conductors;
- wherein the signal interface board is configured to perform conversion between the optical signals and the electrical signals; and
- wherein the signal interface board is configured to condition, in an electrical domain, first ones of the electrical signals for output to the DIB by changing a timing of the first ones of the electrical signals so that the timing is consistent with a data stream protocol used on the DIB.

16. The test system of claim 15, wherein the test head is devoid of a test instrument or test electronics.

17. The test system of claim 15, further comprising:
- an isolation power supply that is external to the test head, the isolation power supply to provide power from a location of means for generating to the test head;
- wherein the electrical signals in the test head are referenced with respect to an instrument ground; and
- wherein the instrument ground acts as a ground reference for the isolation power supply.

* * * * *